United States Patent

Mizuno et al.

[11] Patent Number: 5,956,616
[45] Date of Patent: Sep. 21, 1999

[54] METHOD OF DEPOSITING THIN FILMS BY PLASMA-ENHANCED CHEMICAL VAPOR DEPOSITION

[75] Inventors: Shigeru Mizuno, Kawasaki; Manabu Tagami; Shinya Hasegawa, both of Fuchu; Yoichiro Numasawa, Machida; Masahito Ishihara, Fuchu; Kiyoshi Nashimoto, Hachiouji; Nobuyuki Takahashi, Sagamihara, all of Japan

[73] Assignee: Anelva Corporation, Fuchu, Japan

[21] Appl. No.: 08/863,298

[22] Filed: May 27, 1997

[30] Foreign Application Priority Data

Jun. 8, 1996 [JP] Japan .................................. 8-166180

[51] Int. Cl.$^6$ .................................................. H01L 21/44
[52] U.S. Cl. .................. 438/680; 438/683; 438/685; 427/255; 427/255.1; 427/255.2; 427/255.7
[58] Field of Search ...................... 438/320, 484, 438/680, 685, 974, 4, 624, 637, 640, 644, 697, 653, 656, 682, 683; 427/255, 255.1, 255.2, 255.7

[56] References Cited

U.S. PATENT DOCUMENTS 5,595,784   1/1997   Kaim et al. ......................... 427/255.2
5,665,640   9/1997   Foster et al. ........................... 438/680

OTHER PUBLICATIONS

"Development of Ti film depositing technology using ECR CVD with minimized Si etching and low Cl content", T. Miyamoto et al.; Jun. 27–29, 1995, VMIC Conference.

"Preparation of TiN Films by Electron Cyclotron Resonance Plasma Chemical Vapor Deposition"; T. Akahori et al.; vol. 30, No. 12B, Dec. 1991, pp. 3558–3561, *Japanese Journal of Applied Physics*; and.

"Plasma–Enhanced Chemical Vapor Deposition of TiN from $TiCl_4/N_2/H_2$ Gas Mixtures", N.J. Lanno et al.; *J. Electrochem. Soc.*, vol. 136, No. 1, Jan. 1989.

*Primary Examiner*—Chandra Chaudhari
*Assistant Examiner*—Reneé R. Berry
*Attorney, Agent, or Firm*—Burns, Doane, Swecker & Mathis, LLP

[57] ABSTRACT

A method of depositing a thin film on a substrate by plasma-enhanced CVD is provided. The method includes introducing $H_2$ or $H_2$ and $N_2$ into a plasma-enhanced CVD reactor; generating a plasma in the reactor; introducing a reaction gas comprising $TiCl_4$, silane, and either $H_2$ or $H_2$ and $N_2$ into the reactor; and depositing a Ti film or a TiN film containing Si on a substrate in the reactor.

14 Claims, 6 Drawing Sheets

METHOD OF DEPOSITING THIN FILMS BY PLASMA-ENHANCED CHEMICAL VAPOR DEPOSITION

CROSS-REFERENCE TO RELATED APPLICATIONS

This application claims the right of priority under 35 U.S.C. § 119 to Patent Application No. 8-168180, filed on Jun. 8, 1996, in Japan; the content of which is hereby incorporated by reference.

BACKGROUND OF THE INVENTION

1. Field of the Invention

The present invention generally relates to a method of depositing thin films by plasma-enhanced chemical vapor deposition (CVD). In particular, the invention relates to a method of depositing thin films whereby a thin film is deposited on a substrate surface using a plasma-enhanced CVD reaction in the production process of a semiconductor device.

2. Description of the Related Art

Progress has been made in recent years in semiconductor processing by increasing the degree of integration of the circuit elements and by producing finer features in semiconductor devices. However, achieving finer circuit elements requires novel techniques, e.g., for embedding adequate films in fine holes (contact holes and via holes), for reducing the size of the step formed in circuit elements, and for preventing the breaking of wiring due to electro-migration or heating as a result of increased current density. New techniques have been developed for certain processes, e.g., for the deposition of blanket tungsten films (B-W films) by a CVD method and for the deposition of Al (aluminum) films by a sputtering method.

When depositing B-W films and Al films, a Ti (titanium) film and a TiN (titanium nitride) film are deposited in the case of a contact hole, for example, between the conducting film and the underlying layer in order to ensure conductivity with the underlying layer, to ensure adhesion, and to prevent inter-diffusion (to ensure barrier properties). In the case of elements with wiring line widths ranging from 1.0 to 0.25 $\mu$m, a sputtering method is used for depositing the Ti film and the TiN film. However, in the case of elements with wiring line widths ranging from 0.25 to 0.1 $\mu$m, it is difficult to obtain satisfactory step coverage with a sputtering method. As a result, a plasma-enhanced CVD method whereby a thin film is deposited by a gas phase growth using a plasma-enhanced chemical reaction in the vicinity of the substrate surface has been used.

To deposit a Ti film using the plasma-enhanced CVD method, a plasma is generated with hydrogen ($H_2$) gas which has been introduced beforehand in a reactor, a reaction gas containing titanium tetrachloride ($TiCl_4$) and $H_2$ is then introduced into the reactor, the $TiCl_4$ or a precursor produced by degradation of the $TiCl_4$ is reduced by the active hydrogen ions and atoms generated by the plasma, and a Ti film is deposited on the substrate. Similarly, to deposit a TiN film using the plasma-enhanced CVD method, a plasma is generated with a gaseous mixture of nitrogen ($N_2$) and hydrogen ($H_2$), a reaction gas mixture of $TiCl_4$, $N_2$, and $H_2$ is then introduced into the reactor, the $TiCl_4$ or precursor is nitrided by the active nitrogen ions and atoms generated by the plasma, and a TiN film is deposited on the substrate. Titanium tetrachloride ($TiCl_4$) is used as the reactive gas in the methods described above because the surface of the deposited film is smooth, and the step coverage is excellent.

Typical apparatus used for depositing such thin films include either a parallel plate type plasma-enhanced CVD apparatus which uses a radio frequency (RF) of 13.56 MHz to generate the plasma (see, e.g., N. J. Lanno et al., J. Electrochem. Soc., 136 (1989), p.276) or an electron cyclotron resonance (ECR) type plasma-enhanced CVD apparatus which produces a high density plasma (see, e.g., T. Akahori et al. J. Appl. Phys., 30 (1991), p.3558; and T. Miyamoto, Proceedings of the VLSI Multilevel Interconnection Conference, (1995), p.195).

However, the conventional plasma-enhanced CVD techniques described above have certain drawbacks. For example, when a parallel plate type plasma-enhanced CVD apparatus having a frequency of 13.56 MHz is employed, chlorine (Cl) from the $TiCl_4$ reaction gas remains in the deposited Ti film or TiN film. This residual chlorine corrodes the Al wiring film. In addition, a lot of undegraded $TiCl_4$ remains in the plasma. The undegraded $TiCl_4$ erodes the Si in the underlayer at the bottom of a contact hole. The erosion of the Si underlayer is a problem in that it decreases the surface smoothness of the Ti film or TiN film, and lowers the reliability of the circuit elements.

When an ECR type plasma-enhanced CVD apparatus is used, a high density plasma is obtained. As a result, there is less undegraded $TiCl_4$. Additionally, the amount of Cl in the Ti film or TiN film is lower. This is because some of the Cl from the $TiCl_4$ reaction gas is removed by the active hydrogen ions and atoms which are produced in greater quantities. However, not enough of the Cl is removed. Moreover, the Ti film and TiN film step coverage properties are inadequate when using an ECR type plasma-enhanced CVD apparatus. Consequently, the barrier properties cannot be ensured satisfactorily, and the reliability of the elements is reduced.

The aforementioned problems have been outlined by particular reference to contact holes, but the same can be said with other types of fine hole such as via holes. Via holes are formed in an $SiO_2$ layer which is formed over a metal layer. In the case of a via hole, only a TiN film is deposited on the underlayer so that only the problems associated with TiN film deposition are of concern.

It is an object of the present invention to solve the problems associated with conventional plasma-enhanced CVD processes mentioned above. In particular, it is an object of the present invention to provide a method for depositing thin films, e.g., Ti films or TiN films, by plasma-enhanced CVD in which the amount of chlorine remaining in the Ti film or TiN film is low, the erosion of the underlayer is minimized, the surface of the deposited film is smooth, the step coverage properties are good, the production yield is increased, and the reliability of the elements is increased. As will be readily apparent from the description below, the present invention achieves these and other objects.

SUMMARY OF THE INVENTION

In one aspect, the present invention relates to a method of depositing a Ti film on a substrate by plasma-enhanced CVD. The method includes introducing $H_2$ (hydrogen) into a plasma-enhanced CVD reactor; generating a plasma in the reactor; introducing a reaction gas comprising $TiCl_4$, silane, and $H_2$ into the reactor; and depositing a Ti film containing Si on a substrate in the reactor.

Preferably, the plasma is generated with $H_2$. The reaction gas contains $TiCl_4$, $SiH_4$, and $H_2$. The molar flow rate ratio of $SiH_4$ to $TiCl_4$ is greater than 0 and less than or equal to 0.5. Also preferably, the Ti film contains greater than 0 and less than or equal to 49 mol % of Si.

In another aspect, the present invention relates to a method of depositing a TiN film by plasma-enhanced CVD. The method includes introducing $H_2$ and $N_2$ into a plasma-enhanced CVD reactor; generating a plasma in the reactor; introducing a reaction gas comprising $TiCl_4$, silane, $H_2$, and $N_2$ into the reactor; and depositing a TiN film containing Si on a substrate in the reactor.

Preferably, the plasma is generated with $H_2$ and $N_2$. The reaction gas contains $TiCl_4$, $SiH_4$, $H_2$, and $N_2$. The molar flow rate ratio of $SiH_4$ to $TiCl_4$ is greater than 0 and less than or equal to 0.5. Also preferably, the TiN film contains greater than 0 and less than or equal to 20 mol % of Si.

The plasma mentioned above is preferably generated using electrical power of a frequency higher than 13.56 MHz. More preferably, the frequency of the electrical power ranges from 30 to 200 MHz.

In the methods of depositing thin films according to the present invention, the silane gas radicals which are generated by the plasma bring about the $TiCl_4$ reduction reaction effectively. As a result, the amount of residual Cl in the Ti film or TiN film formed on the substrate is small. Moreover, there is little or no erosion of the Si underlayer in the bottom of the contact hole, for example, of a semiconductor device. Consequently, the Ti film or TiN film produced according to the present invention has excellent surface smoothness.

These beneficial results are maximized when the molar flow rate ratio of $SiH_4$ to $TiCl_4$ ranges from 0.1 to 0.5. Additionally, if the frequency of the electrical power being supplied is higher than 13.56 MHz, then the electron density in the plasma is increased, and a higher density plasma is generated. A higher density plasma would degrade the $TiCl_4$ more effectively and would promote the dissociation of the $SiH_4$. The degradation of $TiCl_4$ and the dissociation of $SiH_4$ are especially pronounced at frequencies of 30 MHz and above. However, a frequency of not more than 200 MHz is appropriate for generating plasma in a stable manner in a parallel plate type plasma-enhanced CVD apparatus.

BRIEF DESCRIPTION OF THE DRAWINGS

FIG. 4(A) is a photograph taken with an electron microscope of the cross-sectional surface and the surface of a Ti film prepared using a conventional method, and FIG. 4(B) is a photograph taken with an electron microscope of the cross-sectional surface and the surface of a Ti film prepared according to the present invention.

FIG. 5(A) is a photograph taken with an electron microscope of the cross-sectional surface and the surface of a TiN film prepared using a conventional method, and FIG. 5(B) is a photograph taken with an electron microscope of the cross-sectional surface and the surface of a TiN film prepared according to the present invention.

DETAILED DESCRIPTION OF THE PREFERRED EMBODIMENTS

The preferred embodiments of the present invention are described below with reference to the attached drawings.

Figure 1:
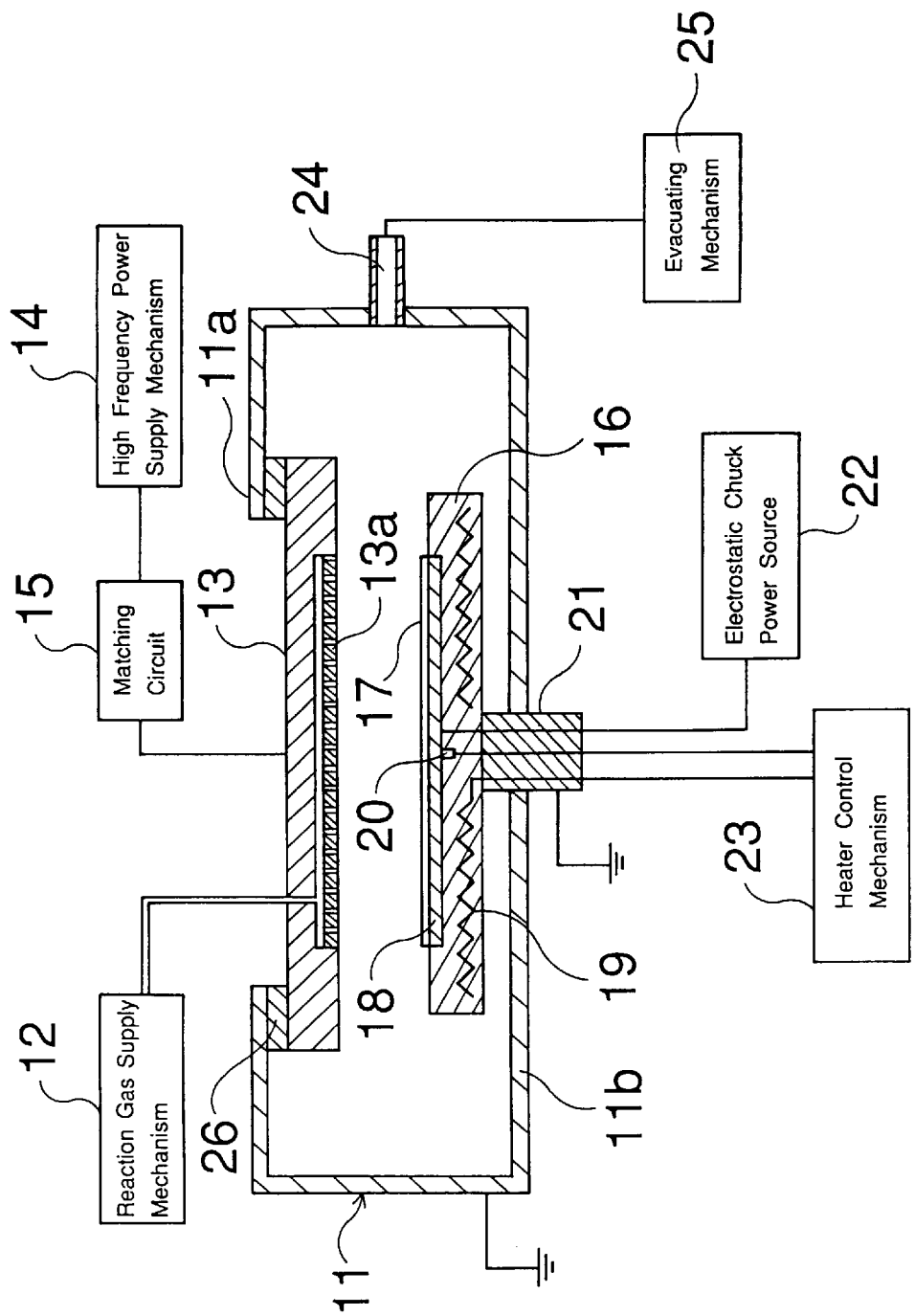
FIG. 1 is a cross-sectional view of the internal structure of the reactor of a plasma-enhanced CVD apparatus suitable for use in the present invention.

The reactor of a plasma-enhanced CVD (PECVD) apparatus, which is an exemplary embodiment of the invention, is shown diagrammatically in FIG. 1. Such a plasma-enhanced CVD apparatus can be used to deposit titanium nitride (TiN) films or titanium (Ti) films which contain silicon (Si) on a substrate. In this embodiment, a reaction gas containing titanium tetrachloride ($TiCl_4$) and silane ($Si_nH_{2n+2}$: n is an natural number) can be introduced to deposit the Ti film or TiN film. $SiH_4$, for example, can be used as the silane. When depositing a Ti film using the aforementioned plasma-enhanced CVD apparatus, hydrogen ($H_2$) is introduced beforehand, a plasma is generated, and a reaction gas containing $TiCl_4$, silane, and $H_2$ is introduced. When depositing a TiN film using the aforementioned plasma-enhanced CVD apparatus, hydrogen ($H_2$) and nitrogen ($N_2$) are introduced beforehand, a plasma is generated, and a reaction gas containing $TiCl_4$, silane, $H_2$, and $N_2$ is introduced.

The construction of the apparatus is described below with reference to FIG. 1. A gas delivery part 13 is provided in the upper wall 11a of the reactor 11 for introducing the reaction gas which is supplied from the reaction gas supply mechanism 12 into the reactor 11. The gas delivery part 13 is fitted to the reactor 11 via the insulator 26. The gas delivery part 13 is formed from an electrically conductive material. A voltage of fixed frequency is applied to the gas delivery part 13 via the matching circuit 15 from the power supply mechanism 14. On the other hand, the reactor 11 is grounded and maintained at ground potential. The gas delivery part 13 and the reactor 11 are electrically insulated from one another by the insulator 26.

A substrate holder 16 is provided along the bottom wall 11b of the reactor 11. An electrostatic chuck (ESC) plate 18 for fixing a substrate 17 is provided on the substrate mounting surface of the substrate holder 16 (the upper surface in FIG. 1) which faces the lower surface (the gas discharge surface) 13a of the gas delivery part 13. A heater 19 and a thermocouple 20 are provided within the substrate holder 16. The substrate holder 16 is fixed in the lower portion inside the reactor 11 by means of the support 21. The substrate holder 16 is also grounded through the grounded reactor 11. The required voltage is supplied from the ESC power source 22 to the electrostatic chuck (ESC) plate 18. Temperature data obtained by measurement with the thermocouple 20 is input to the heating control mechanism 23. The heating control mechanism 23 maintains the substrate holder 16 at a desired temperature by applying the required electrical power to the heater 19 on the basis of the measured temperature data.

A vent 24 connected to the external evacuating mechanism (pump mechanism) 25 is provided in the side wall of the reactor 11. The pressure in the space within the reactor 11 is reduced by means of an evacuating mechanism 25.

A substrate 17 which has been transferred into the reactor 11 via a transfer port (not shown) is fixed by means of an electrostatic chuck plate 18. The electrostatic chuck plate 18 is controlled by the electrostatic chuck power source 22 on the substrate holder 16.

Hydrogen ($H_2$) in the case of Ti film deposition, or $H_2$ and $N_2$ in the case of TiN film deposition, is/are introduced from the gas delivery part 13 which faces the substrate holder 16 and is/are evacuated via the vent 24 by means of the evacuating mechanism 25. The interior of the reactor 11 is maintained at a desired pressure.

A plasma is generated in the space between the gas delivery part 13 and the substrate holder 16, i.e., the space in front of the surface of the substrate 17, by applying electrical power to the gas delivery part 13 by means of the power supply mechanism 14. In this embodiment, the power supply mechanism 14 puts out electrical power with a fixed frequency within the range of 30 to 200 MHz.

The reaction gas which contains $TiCl_4$ and silane, e.g., $SiH_4$, is introduced into the reactor 11 from the gas delivery part 13 when the generated plasma has become stable. $H_2$ is included in the reaction gas when depositing a Ti film, and $H_2$ and $N_2$ are included in the reaction gas when depositing a TiN film. Silane radicals are generated in the plasma. The silane radicals reduce the $TiCl_4$ or precursor which is generated by the degradation of the $TiCl_4$. Such a reducing reaction deposits a Ti film containing Si on the substrate 17, which is being maintained at a high temperature, in the case of Ti film deposition, or a TiN film containing Si in the case of TiN film deposition. As used herein, a "Ti film containing Si" signifies a film where Si is included in metallic Ti, and a "TiN film containing Si" signifies a film in which Si is included in TiN. Additionally, in the description below, the term "Ti film" or "TiN film" signifies a Ti film or a TiN film containing Si, unless otherwise specified.

The unreacted gas and the product gas in the reactor 11 are pumped out of the system through the vent 24 by means of the evacuating mechanism 25.

The conditions for depositing a Ti film are as follows:
a) reaction gas flow rates:
  i) $TiCl_4$=2–10 sccm,
  ii) $H_2$=300–1000 sccm, and
  iii) $SiH_4$=0.2–4 sccm;
b) substrate holder temperature=400–700° C.;
c) pressure=50–500 mTorr; and
d) 30–200 MHz frequency power supply=50–3000 W.

The conditions for depositing a TiN film are as follows:
a) reaction gas flow rates:
  i) $TiCl_4$=2–10 sccm,
  ii) $H_2$=300–1000 sccm,
  iii) $N_2$=8–40 sccm, and
  iv) $SiH_4$=0.2–4 sccm;
b) substrate holder temperature=400–700° C.;
c) pressure=50–500 mTorr; and
d) 30–200 MHz frequency power supply=50–3000 W.

In terms of the aforementioned film deposition conditions, a molar flow rate ratio of $SiH_4$ to $TiCl_4$ of not more than 0.5 (excluding zero) is preferred for Ti film deposition. If the molar flow rate ratio conditions are expressed in terms of the Si content measured by RBS (Rutherford back-scattering spectrometry), then the Si content in a Ti film is preferably not more than 49 mol %. In the case of TiN film depositions, a molar flow rate ratio of $SiH_4$ to $TiCl_4$ is also preferably not more than 0.5 (excluding zero). And if the molar flow rate ratio conditions are expressed in terms of the Si content measured by RBS, then the Si content in a TiN film is preferably not more than 20 mol %. The molar flow rate ratio of $SiH_4$ to $TiCl_4$ is discussed in more detail below.

In the method of depositing a Ti film or TiN film using a plasma-enhanced CVD apparatus described above, the silane radicals generated by the plasma undergo effectively a reducing reaction with the $TiCl_4$ or precursor thereof. As a result, a thin film of either of the aforementioned materials deposited on the substrate 17 by the reducing reaction contains little residual chlorine (Cl).

The relationships between the $SiH_4$ flow rate and the Cl concentration in a Ti film or TiN film which has been deposited by the method of the embodiment described above are shown in FIGS. 2(A) and 2(B). The concentration of Cl in the films was analyzed quantitatively using secondary ion mass spectrometry.

In the case of Ti film deposition, the film deposition conditions other than the $SiH_4$ flow rate were as follows: substrate holder temperature=600° C. (the substrate temperature at this time was 485° C.); pressure=120 mTorr; 60 MHz frequency power=500 W; $TiCl_4$=5 sccm; and $H_2$=500 sccm.

Similarly, in the case of TiN film deposition, the film deposition conditions other than the $SiH_4$ flow rate were as follows: substrate holder temperature=600° C. (the substrate temperature at this time was 485° C.); pressure=120 mTorr; 60 MHz frequency power=500 W; $TiCl_4$=5 scam; $N_2$=20 sccm; and $H_2$=500 sccm.

Figure 2:
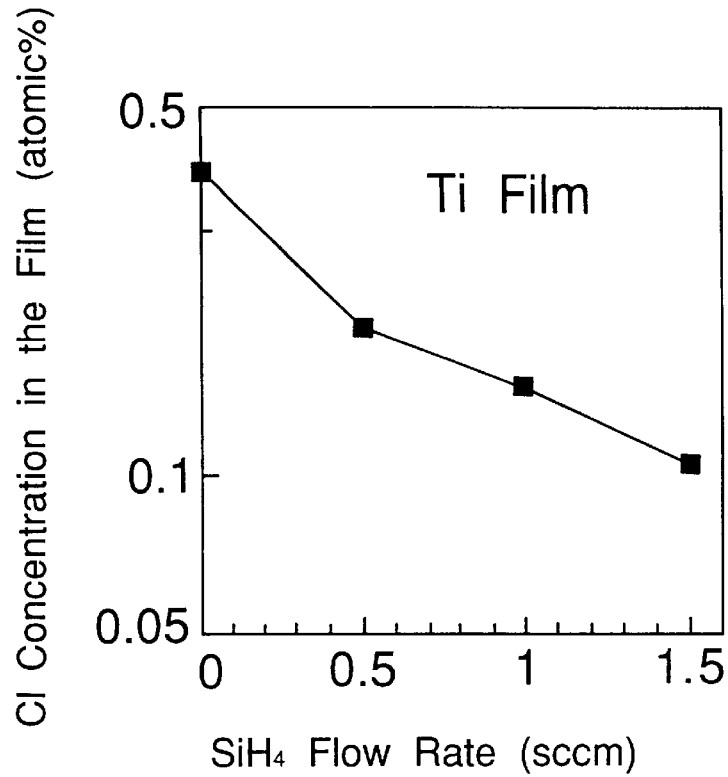
FIG. 2(A) is a graph showing the relationship between the Cl concentration in a Ti film and the $SiH_4$ flow rate.
FIG. 2(B) is a graph showing the relationship between the Cl concentration in a TiN film and the $SiH_4$ flow rate.
Figure 2:
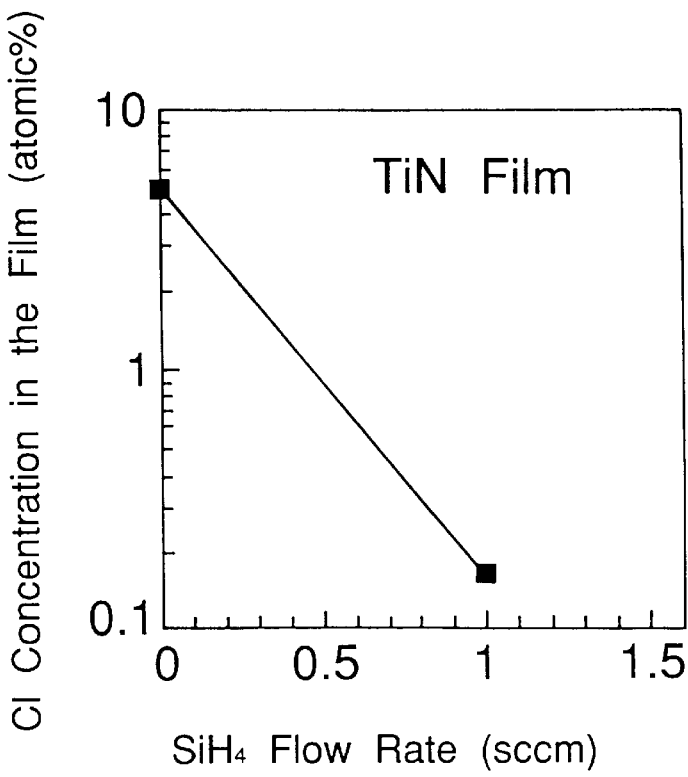

It is clear from FIGS. 2(A) and 2(B) that the Cl concentration in both the Ti film and the TiN film falls as the flow rate of the $SiH_4$ is increased. In the case of the Ti film, the Cl concentration in the film formed according to the conventional method, i.e., where no $SiH_4$ was added, was about 0.4 atomic %. The Cl concentration fell to about 0.15 atomic % when 1.0 sccm $SiH_4$ was being added and to about 0.10 atomic % when 1.5 sccm $SiH_4$ was being added. On the other hand, in the case of a TiN film, the Cl concentration in the film formed according to the conventional method, i.e., where no $SiH_4$ was added, was about 5 atomic %. The Cl concentration fell to about 0.2 atomic % when 1.0 sccm $SiH_4$ was being added. As indicated above, the Cl concentration in both the Ti film and the TiN film is not more than 0.2 atomic %.

Figure 3:
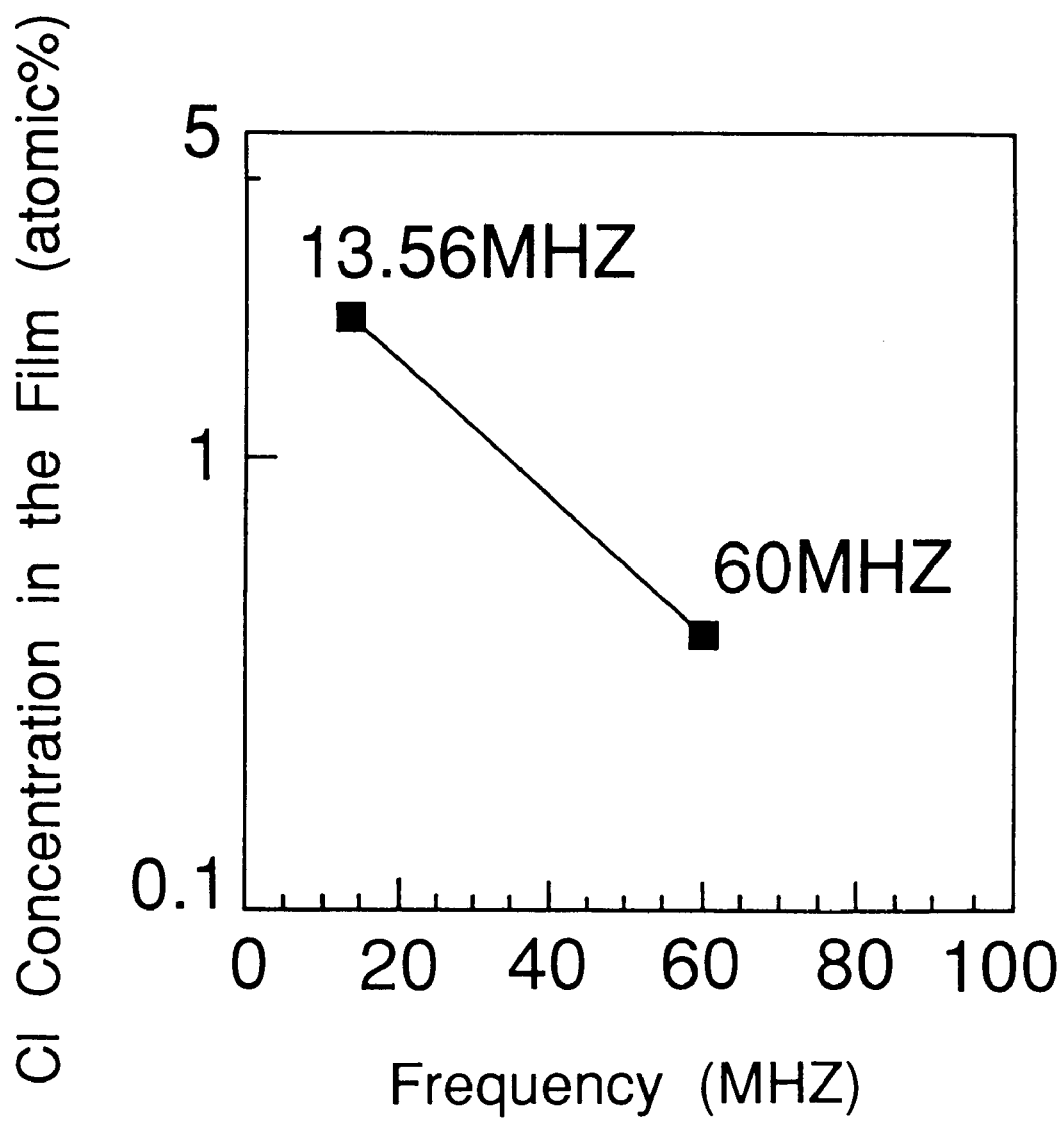
FIG. 3 is a graph showing the relationship of the Cl concentration in a Ti film and the frequency of the power supply for forming the plasma.

To further reduce the Cl content of the resulting film, a power supply having a frequency of higher than the 13.56 MHz, which is generally employed in conventional methods, is used. A graph showing the cl concentration of a Ti film deposited using a power supply having a frequency higher than 13.56 MHz is shown in FIG. 3. At the frequency of 13.56 MHz, which is generally used in a conventional parallel plate apparatus, the Cl concentration in the Ti film is about 2 atomic %. On the other hand, when a frequency of 60 MHz, which is according to the present invention, is used, the Cl concentration in the Ti film is reduced to about 0.4 atomic %.

The electron density in the plasma increases as the frequency of the power supply increases. Thus, when a power supply having a frequency higher than 13.56 is used, a high density plasma is formed. A high density plasma allows the $TiCl_4$ to be degraded more effectively. As a result, the Cl concentration in the Ti film is reduced. The reduction in the Cl concentration is especially pronounced at frequencies of 30 MHz and above. A frequency of not more than 200 MHz is appropriate for generating plasma in a stable manner in a parallel plate type plasma-enhanced CVD apparatus. Thus, the use of a frequency within the range of 30 MHz to 200 MHz is the optimum frequency condition for the power supply in a parallel plate type plasma-enhanced CVD apparatus.

Figure 4:
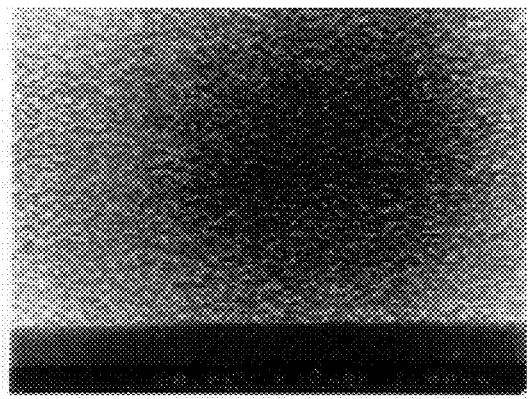
FIGS. 4(A) and 4(B) are photographs of thin films which have been deposited on a substrate.
Figure 4:
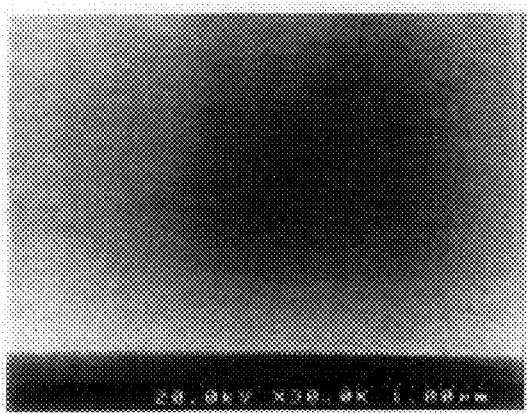

As mentioned above, the surface smoothness of a Ti film can be greatly improved by using the method of depositing a thin film according to the present invention. This is shown in FIG. 4. FIG. 4(A) is a photograph of the surface smoothness of a Ti film prepared using the conventional method ($TiCl_4$ reduced using $H_2$ with a $SiH_4$ flow rate of 0 sccm), while FIG. 4(B) is a photograph of the surface smoothness of a Ti film prepared using the method of this invention (using $TiCl_4$ and $SiH_4$, reducing with $H_2$, with a $SiH_4$ flow rate of 1.0 sccm). The photographs in FIGS. 4(A) and 4(B) were taken using an electron microscope viewing the cross-section of the respective Ti films at an angle inclined at 45° from above. They show the cross-sectional surface and the surface of the thin films. The film deposition conditions apart from the $SiH_4$ flow rate were as follows: substrate holder temperature=600° C.; pressure=120 mTorr; 60 MHz frequency power=500 W; $TiCl_4$=5 scam; and $H_2$=500 sccm.

As seen in FIG. 4(A), the Ti film prepared using the conventional method has a pronounced roughness and granularity. In contrast, the Ti film prepared using the method of this invention, as shown in FIG. 4(B), clearly has a smooth surface. This is because in the conventional method, the $TiCl_4$ reacts with the underlying Si substrate (Si erosion) and roughens the surface. On the other hand, in the method of the present invention, the $TiCl_4$ reacts with $SiH_4$ radicals instead of with the underlying Si substrate. Consequently, there is no roughening of the Ti film surface due to erosion of the Si substrate. Thus, excellent smoothness is obtained with the method of this invention. Further, when the Si underlayer at the bottom of a contact hole in a semiconductor element is not eroded and a Ti film is deposited thereon, a Ti film having highly reliable electrical characteristics can be obtained.

The improvement in smoothness is especially pronounced when the molar flow rate ratio of $SiH_4$ to $TiCl_4$ is at least 0.1. If the molar flow rate ratio of $SiH_4$ to $TiCl_4$ exceeds 0.5, there is an excess of $SiH_4$, and the abnormal growth of Si grains and grains of tungsten silicide has been observed. Hence, the optimum molar flow rate ratio of $SiH_4$ to $TiCl_4$ in the method for depositing a thin film according to the present invention is within the range of 0.1 to 0.5.

Figure 5:
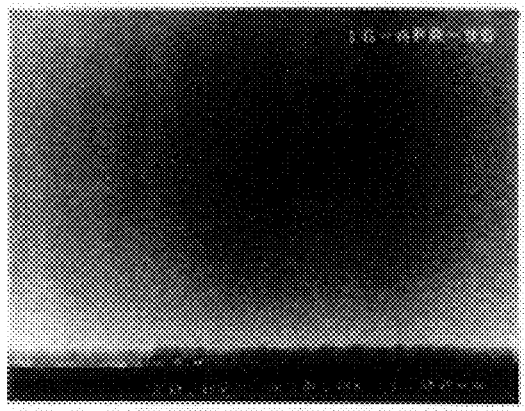
FIGS. 5(A) and 5(B) are photographs of thin films which have been deposited on a substrate.
Figure 5:
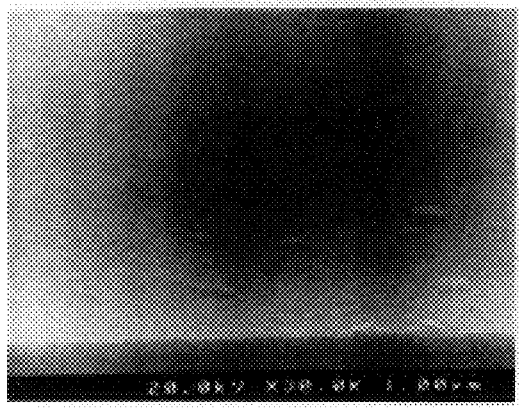

As shown in FIG. 5, excellent surface smoothness can also be achieved with a TiN film using the method for depositing a thin film according to the present invention. Moreover, amorphous films which are effective as barrier films in semiconductor elements can be obtained. FIG. 5(A) is a photograph of the surface smoothness of a TiN film prepared using the conventional method (reduction of the $TiCl_4$ with $H_2$, when the $SiH_4$ flow rate was 0 sccm), while FIG. 5(B) is a photograph of the surface smoothness of a TiN film prepared using the method of this invention (using $TiCl_4$ and $SiH_4$, reduction with $H_2$, when the $SiH_4$ flow rate was 1.0 sccm). The photographs in FIGS. 5(A) and (B) were taken with an electron microscope viewing the cross-section of the respective TiN films at an angle inclined at 45° from above. They show the cross-sectional surface and the surface of the thin films. The film deposition conditions apart from the $SiH_4$ flow rate were as follows: substrate holder temperature=600° C.; pressure=120 mTorr; 60 MHz frequency power=500 W; $TiCl_4$=5 sccm; $N_2$=20 sccm; and $H_2$=500 sccm.

A fine columnar crystal structure can be seen in FIG. 5(A) in the TiN film obtained using the conventional method. If a TiN film which has a columnar crystal structure is used as a barrier film, the atoms, e.g., Al and W, which form the wiring which is deposited on top diffuse to the underlayer via the crystal grain boundaries and react with the underlying Si. Consequently, there is a problem in that a current leakage could result. In contrast, in the method according to the present invention, the surface of the TiN film is smooth when compared with a film obtained using the conventional method, as shown in FIG. 5(B). No columnar crystal structure can be seen, and the surface smoothness is excellent. As a result, such a surface would be effective as a barrier film in a semiconductor element.

Figure 6:
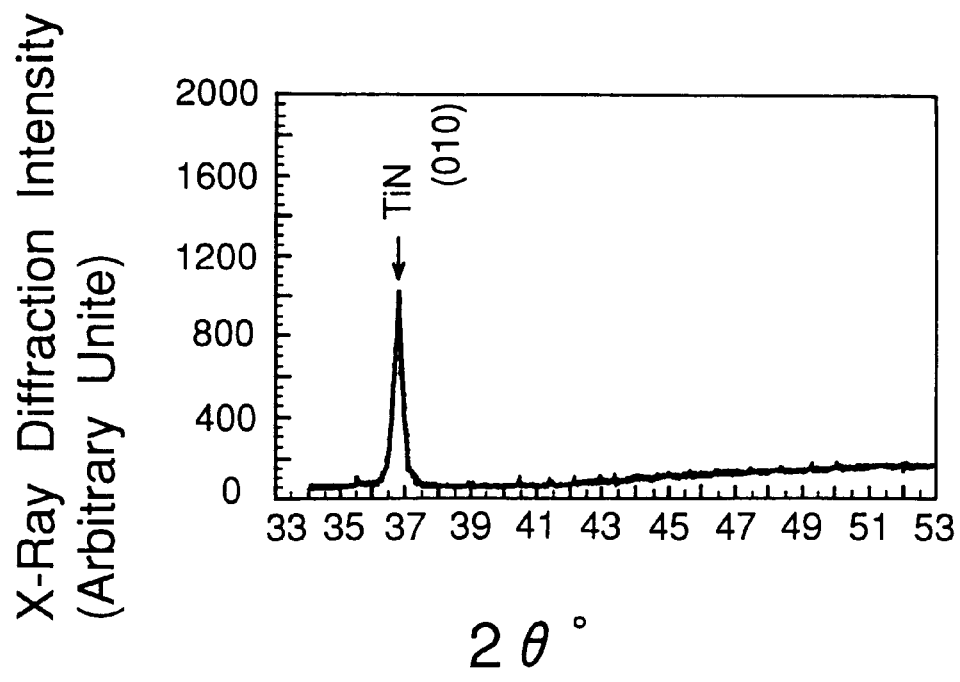
FIG. 6(A) is a graph showing the X-ray diffraction peaks of a TiN film prepared using a conventional method.
FIG. 6(B) is a graph showing the X-ray diffraction peaks of a TiN film prepared using the method according to the present invention.
Figure 6:
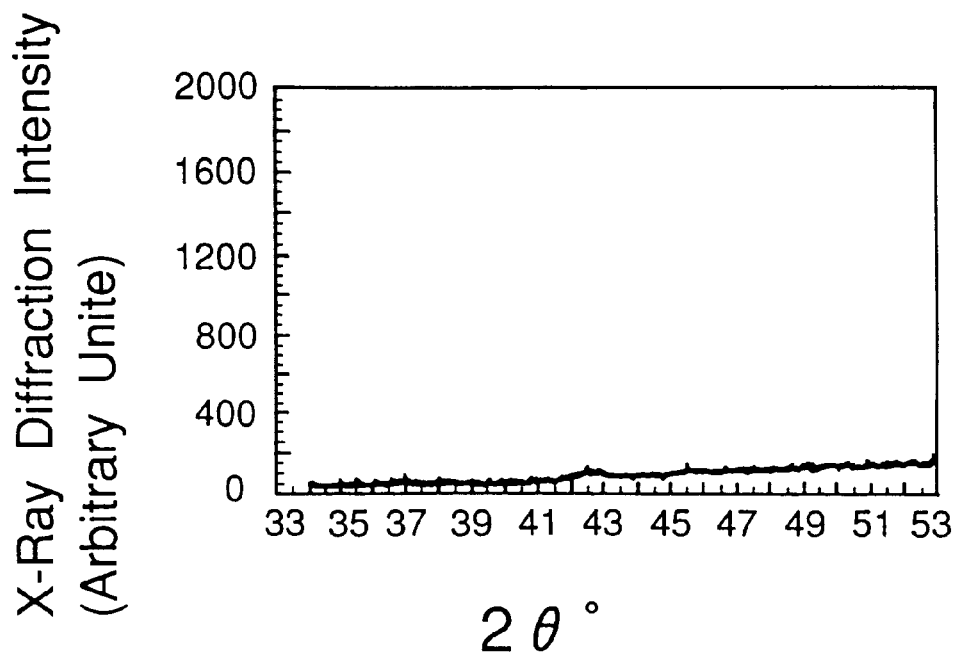

FIG. 6(A) shows the X-ray diffraction peaks of a TiN film obtained using the conventional method ($TiCl_4$ reduced with $H_2$ at a $SiH_4$ flow rate of 0 sccm), while FIG. 6(B) shows the x-ray diffraction peaks of a TiN film obtained using the method of this invention (with the addition of $SiH_4$ at a flow rate of 1.0 sccm). As shown in FIG. 6(A), a TiN (010) crystal plane peak corresponding to the aforementioned columnar crystal structure can be seen in the TiN film obtained using the conventional method. Thus, it is clear that the film has been crystallized. In contrast, as shown in FIG. 6(B), no distinct diffraction peak is seen in the TiN film obtained using the method of the present invention. Thus, it is clear that the film is in an amorphous state. Moreover, no peaks outside the range of 2θ can be seen in FIG. 6(B).

The TiN film prepared in accordance with the present invention is an amorphous film with no crystal grain boundaries. As a result, it is ideal as a barrier film in a semiconductor element. This effect is especially pronounced when the molar flow rate ratio of $SiH_4$ to $TiCl_4$ is at least 0.1. If the molar flow rate ratio exceeds 0.5, the $SiH_4$ is in excess, and abnormal growth of Si grains and titanium silicide occurs. The aforementioned molar flow rate ratio is preferably not more than 0.5. Hence, a molar flow rate ratio of $SiH_4$ to $TiCl_4$ ranging from 0.1 to 0.5 is preferred for TiN film deposition in the method of this invention.

As seen from the above, the surface smoothness of a Ti film or a TiN film is improved with the method of depositing a thin film according to the present invention. Good results are also obtained in terms of the step coverage with these films. In both Ti films and TiN films, good results with a step coverage factor of 50% have been obtained with holes having a diameter of 0.4 μm and a depth of 1.0 μm. The conditions for Ti film deposition are as follows: substrate holder temperature=600° C.; pressure=120 mTorr; 60 MHz frequency power=500 W; $TiCl_4$=5 sccm; $SiH_4$=1.0 sccm; and $H_2$=500 sccm. The conditions for TiN film deposition are as follows: substrate holder temperature=600° C.; pressure=120 mTorr; 60 MHz frequency power=500 W; $TiCl_4$=5 sccm; $SiH_4$=1.0 sccm; $N_2$=20 sccm; and $H_2$=500 sccm.

$SiH_4$ has been described above as being particularly suitable for use as the silane. However, similar benefits can be obtained using, e.g., $Si_2H_6$ or $Si_3H_8$. Moreover, similar results to those in the aforementioned embodiment can be obtained even if an inert gas, such as Ar, is added.

In the case of via holes, only TiN films are deposited between the underlying layers.

As is clear from the description outlined above, when depositing Ti films and TiN films, or when depositing TiN films alone, by a plasma-enhanced CVD (PECVD) reaction between an underlying layer and a B-W film in accordance with the present invention, it is possible to reduce the amount of residual chlorine in the resulting film so that erosion of the underlayer does not occur and to deposit Ti films and TiN films which have a smooth surface and excellent step coverage. When $TiCl_4$ is introduced as the reaction gas, a silane-based gas such as $SiH_4$ is also introduced as a reaction gas. The silane radicals reduce the $TiCl_4$ and precursors thereof, thereby lowering the residual amount of chlorine in the film. Erosion of the Si underlayer due to the reaction of $TiCl_4$ with the underlying Si does not occur, thereby producing a film having a smooth surface. Moreover, Ti films and TiN films which have excellent step coverage are deposited. As a result, the method for depositing thin films according to the present invention markedly improves the yield and reliability of semiconductor devices.

What is claimed is:

1. A method of depositing a thin film on a substrate by plasma-enhanced CVD, said method comprising the steps of:

(a) introducing $H_2$ into a plasma-enhanced CVD reactor;

(b) generating a plasma in the reactor;

(c) introducing a reaction gas comprising $TiCl_4$, silane, and $H_2$ into the reactor; and (d) depositing a Ti film containing greater than zero and less than or equal to 49 mol % of Si on a substrate in the reactor.

2. The method according to claim 1, wherein the plasma is generated with $H_2$.

3. The method according to claim 1, wherein the silane is $SiH_4$, and the molar flow rate ratio of $SiH_4$ to $TiCl_4$ is greater than 0 and less than or equal to 0.5.

4. The method according to claim 1, wherein the plasma is generated using electrical power of frequency higher than 13.56 MHz.

5. The method according to claim 4, wherein the frequency of the electrical power ranges from 30 to 200 MHz.

6. A method of depositing a thin film on a substrate by plasma-enhanced CVD, said method comprising the steps of:

(a) introducing $H_2$ and $N_2$ into a plasma-enhanced CVD reactor;

(b) generating a plasma in the reactor;

(c) introducing a reaction gas comprising $TiCl_4$, silane, $H_2$, and $N_2$ into the reactor; and (d) depositing a TiN film containing Si on a substrate in the reactor.

7. The method according to claim 6, wherein the plasma is generated with $H_2$ and $N_2$.

8. The method according to claim 6, wherein the silane is $SiH_4$, and the molar flow rate ratio of $SiH_4$ to $TiCl_4$ is greater than 0 and less than or equal to 0.5.

9. The method according to claim 6, wherein the TiN film comprises greater than 0 and less than or equal to 20 mol % of Si.

10. The method according to claim 6, wherein the plasma is generated using electrical power of frequency higher than 13.56 MHz.

11. The method according to claim 10, wherein the frequency of the electrical power ranges from 30 to 200 MHz.

12. The method according to claim 1, wherein the Ti film comprises about 0.4 atomic % of Cl or less.

13. The method according to claim 12, wherein the Ti film comprises about 0.2 atomic % of Cl or less.

14. The method according to claim 6, wherein the TiN film comprises about 0.2 atomic % of Cl or less.

* * * * *